(12) United States Patent
Chiu et al.

(10) Patent No.: US 10,090,167 B2
(45) Date of Patent: Oct. 2, 2018

(54) SEMICONDUCTOR DEVICE AND METHOD OF FORMING SAME

(71) Applicant: Taiwan Semiconductor Manufacturing Company, Ltd., Hsin-Chu (TW)

(72) Inventors: Chien-Chih Chiu, Xinying (TW); Ming-Chung Liang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 21 days.

(21) Appl. No.: 14/515,367

(22) Filed: Oct. 15, 2014

(65) Prior Publication Data
US 2016/0111324 A1 Apr. 21, 2016

(51) Int. Cl.
*H01L 21/311* (2006.01)
*H01L 21/768* (2006.01)

(52) U.S. Cl.
CPC .. *H01L 21/31116* (2013.01); *H01L 21/31144* (2013.01); *H01L 21/76804* (2013.01); *H01L 21/76813* (2013.01); *H01L 21/76877* (2013.01)

(58) Field of Classification Search
CPC ............. H01L 21/768; H01L 21/76816; H01L 21/76838; H01L 21/28026; H01L 21/823475; H01L 21/823871; H01L 23/552; H01L 25/16; H01L 27/14636; H01L 2224/19; H01L 2224/25; H01L 2225/06541

USPC ....... 438/303, 591, 618, 421, 584, 637, 783, 438/763
See application file for complete search history.

(56) References Cited

U.S. PATENT DOCUMENTS

| | | | |
|---|---|---|---|
| 2003/0111732 A1* | 6/2003 | Goda | H01L 21/76838 257/758 |
| 2004/0018714 A1* | 1/2004 | Cooney, III | H01L 21/76811 438/618 |
| 2005/0082674 A1* | 4/2005 | Seta | H01L 21/31116 257/758 |
| 2006/0009024 A1* | 1/2006 | Lee | H01L 21/31138 438/618 |
| 2006/0024948 A1* | 2/2006 | Oh | H01L 21/76807 438/622 |
| 2007/0111519 A1* | 5/2007 | Lubomirsky | C23C 18/1653 438/678 |
| 2007/0243490 A1* | 10/2007 | Miyata | H01L 23/585 430/311 |
| 2008/0171434 A1* | 7/2008 | Chang | H01L 21/31144 438/666 |
| 2009/0121353 A1* | 5/2009 | Ramappa | H01L 21/76808 257/751 |

(Continued)

*Primary Examiner* — Moin Rahman
(74) *Attorney, Agent, or Firm* — Slater Matsil, LLP (57) ABSTRACT

Semiconductor devices and methods of forming the same are disclosed. A dielectric layer is formed over an underlying layer. A first mask layer and a second mask layer are formed on the dielectric layer such that the first mask layer is interposed between the second mask layer and the dielectric layer. An opening is formed in the first mask layer, the second mask layer and the dielectric layer. Subsequently, the second mask layer is removed. The opening is extended and corners of the first mask layer are rounded. A conductive feature is formed in the extended opening.

19 Claims, 5 Drawing Sheets

(56) References Cited

U.S. PATENT DOCUMENTS

2011/0133313 A1* 6/2011 Rangarajan ............. C23C 16/30
257/635
2012/0034551 A1* 2/2012 Yoshikawa ............... G03F 1/14
430/5
2012/0289043 A1* 11/2012 Hsieh ................ H01L 21/76804
438/643

* cited by examiner

SEMICONDUCTOR DEVICE AND METHOD OF FORMING SAME

BACKGROUND

The fabrication of integrated chips can be broadly separated into two main sections, front-end-of-the-line (FEOL) fabrication and back-end-of-the-line (BEOL) fabrication. FEOL fabrication includes the formation of devices (e.g., transistors, capacitors, resistors, etc.) on a semiconductor substrate. BEOL fabrication includes the formation of one or more metal interconnect layers within one or more insulating dielectric layers disposed above the semiconductor substrate. The metal interconnect layers of the BEOL electrically connect individual devices of the FEOL to external pins of an integrated chip.

As features of semiconductor devices are reduced, low dielectric constant (LK) materials and extra-low k (ELK) materials that have dielectric constants less than that of silicon dioxide have begun to be implemented in some designs as insulating materials between interconnects. This poses further integration challenges to manufacturers, since the reduction of the dielectric constant is usually achieved at the expense of useful material properties that are required for interconnect fabrication. Therefore, there is a need for improved interconnect fabrication methods, which resolve certain challenges faced by the semiconductor industry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter. It will be appreciated that "layer," as used herein, contemplates a region, and does not necessarily comprise a uniform thickness. For example, a layer is a region, such as an area comprising arbitrary boundaries. For another example, a layer is a region comprising at least some variation in thickness.

Semiconductor devices and methods of forming the same are provided in accordance with various embodiments. In particular, the intermediate stages of forming interconnect structures in semiconductor devices are illustrated. Throughout the various views and illustrative embodiments, like reference numbers are used to designate like elements.

As described in greater detail below, one or more mask layers are formed on a dielectric layer of a semiconductor device to aid in forming interconnect structures in the dielectric layer. In particular, corners of a mask layer are rounded to improve filling characteristics of openings formed in the dielectric layer. A material of the mask layer and parameters of an etch process that rounds the corners of the mask layer are chosen to obtain a rounded profile of the mask layer, as well as to avoid forming undercuts in the dielectric layer. By reducing or eliminating undercut formation in the dielectric layer, filling characteristics of the openings are improved and adverse effects, such as void formation in the interconnect structures, can be avoided.

Figure 1:
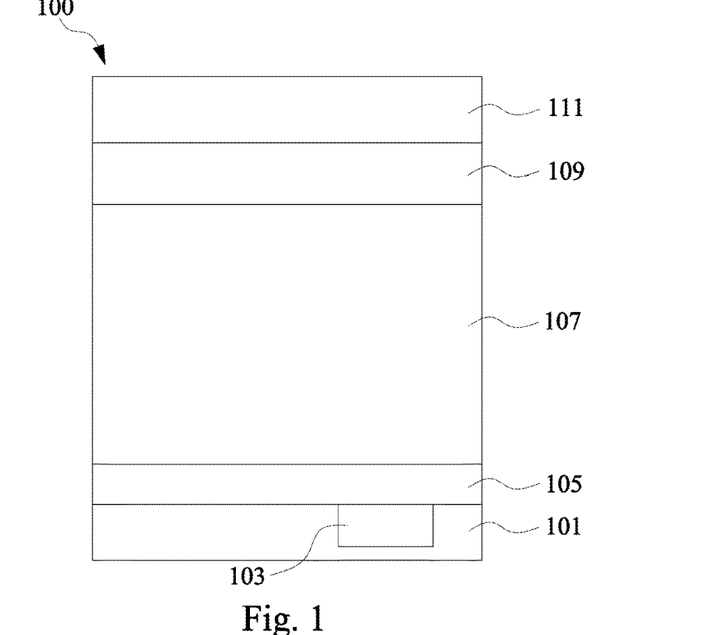
FIGS. 1-5 are cross-sectional views of a semiconductor device at various stages of fabrication in accordance with some embodiments.

FIGS. 1-5 are cross-sectional views of a semiconductor device 100 at various stages of fabrication in accordance with some embodiments. Turning first to FIG. 1, the semiconductor device 100 comprises an underlying layer 101. In some embodiments, the underlying layer 101 may comprise a substrate, active and/or passive devices on the substrate, one or more dielectric layers over the active and/or passive devices and the substrate, and conductive features in the one or more dielectric layers, which are not explicitly illustrated in FIG. 1 as their inclusion is not necessary for understanding various embodiments described below.

The substrate may be formed of silicon, although it may also be formed of other group III, group IV, and/or group V elements, such as silicon, germanium, gallium, arsenic, phosphorus, and combinations thereof. The substrate may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like. Alternatively, the substrate may include a non-semiconductor material, such as glass, fused quartz, or calcium fluoride.

In some embodiments, the active and/or passive devices may include various n-type metal-oxide semiconductor (NMOS) and/or p-type metal-oxide semiconductor (PMOS) devices such as transistors, capacitors, resistors, diodes, photo-diodes, fuses and/or the like.

The one or more dielectric layers may include an inter-layer dielectric (ILD)/inter-metal dielectric layers (IMDs) formed over the substrate. The ILD/IMDs may be formed, for example, of a low-K dielectric material, such as phosphosilicate glass (PSG), borophosphosilicate glass (BPSG), fluorinated silicate glass (FSG), undoped silicate glass (USG), $SiO_xC_y$, SiOCH, Spin-On-Glass, Spin-On-Polymers, high-density plasma (HDP) oxide, tetraethyl ortho silicate (TEOS), plasma-enhanced TEOS (PETEOS), fluorine-doped silicon oxide, carbon-doped silicon oxide, porous silicon oxide, porous carbon-doped silicon oxide, organic polymers, silicone based polymers, compounds thereof, composites thereof, combinations thereof, or the like, by any suitable method known in the art, such as spin-on, atomic layer deposition (ALD), chemical vapor deposition (CVD), plasma enhanced chemical vapor deposition (PECVD), the like, or a combination thereof.

In some embodiments, interconnects may be formed in the ILD/IMDs using, for example, a damascene process, a dual damascene process, or the like. The ILD/IMDs may be patterned using photolithography techniques to form trenches and vias. The interconnects are formed by depositing a suitable conductive material in the trenches and the vias of the ILD/IMDs using various deposition and plating methods, or the like. In addition, the interconnects may include one or more barrier/adhesion layers (not shown) to protect the ILD/IMDs from diffusion and metallic poisoning. The one or more barrier/adhesion layers may comprise W, WN, Ti, Al, TiAl, TiN, TiAlN, Ta, TaC, TaN, TaCN, TaSiN, Mn, Zr, Nb, Ru, the like, or a combination thereof. The barrier layer may be formed using PVD, ALD, sputtering, the like, or a combination thereof. The conductive material of the interconnects may comprise Cu, a Cu alloy, Ag, Au, W, Al, the like, or a combination thereof. The interconnects may also comprise one or more cap layers having a composition of the formula $M_xO_yN_z$, where M is a metal, O is oxygen, and N is nitrogen. Generally, the metal is selected from the group consisting of Al, Mn, Co, Ti, Ta, W, Ni, Sn, Mg, or combinations thereof.

In an embodiment, the steps for forming the interconnects may include blanket forming the one or more barrier/adhesion layers, depositing a thin seed layer of a conductive material, and filling the trenches and the vias in the ILD/IMDs with the conductive material, for example, by plating. A chemical mechanical polishing (CMP) is then performed to remove excess portions of the interconnects. In some embodiments, the interconnects may provide electrical connections between the various passive and/or active devices formed on the substrate.

In some embodiments, the underlying layer 101 further comprises a conductive feature 103 as illustrated in FIG. 1. The conductive feature 103 may be a gate electrode, a conductive contact such as, for example, a tungsten plug, a conductive poly-silicon line, or an interconnect, such as those discussed above.

Referring further to FIG. 1, a dielectric layer 107 is formed over the underlying layer 101. The dielectric layer 107 may be formed, for example, of a low-K dielectric material, such as phosphosilicate glass (PSG), borophosphosilicate glass (BPSG), fluorinated silicate glass (FSG), undoped silicate glass (USG), $SiO_xC_y$, SiOCH, Spin-On-Glass, Spin-On-Polymers, high-density plasma (HDP) oxide, tetraethyl orthosilicate (TEOS), plasma-enhanced TEOS (PETEOS), fluorine-doped silicon oxide, carbon-doped silicon oxide, porous silicon oxide, porous carbon-doped silicon oxide, organic polymers, silicone based polymers, compounds thereof, composites thereof, combinations thereof, or the like, by any suitable method known in the art, such as spin-on, ALD, CVD, PECVD, the like, or a combination thereof.

Before depositing the dielectric layer 107 over the underlying layer 101, an etch stop layer (ESL), such that the first ESL 105 may be interposed between the underlying layer 101 and the dielectric layer 107. In some embodiments, the first ESL 105 may comprise SiO, SiC, SiN, SiOC, SiON, SiCN, TiN, MN, AlON, TEOS, hard black diamond (HBD), or the like. Alternatively, the first ESL 105 may be formed by depositing and annealing a metal oxide of Hf, Al, or the like. The first ESL 105 may be formed using a suitable process such as ALD, CVD, PVD, the like, or combinations thereof. Generally, an ESL is formed of a material exhibiting a low etch rate as compared to the overlying material. As described below in greater detail, the first ESL 105 acts as an etch stop layer for etching the dielectric layer 107. In this situation, the material used to form the first ESL 105 is selected such that the first ESL 105 will have a lower etch rate than the material of the dielectric layer 107. In this manner, the etch process essentially stops at the first ESL 105 due to the low etch rate.

Referring further to FIG. 1, a first mask layer 109 and a second mask layer 111 are formed over the dielectric layer 107, such that the first mask layer 109 is interposed between the dielectric layer 107 and the second mask layer 111. As described in greater detail below, the first mask layer 109 and the second mask layer 111 are used to aid in etching of the dielectric layer 107. The first mask layer 109 and the second mask layer 111 may be formed using an oxidation process, ALD, CVD, PVD, or a combination thereof. In some embodiments, the first mask layer 109 includes a dielectric material, such as silicon oxide, silicon nitride, silicon oxynitride, silicon carbide, silicon carbonitride, or other suitable materials. Therefore, the first mask layer 109 may be also referred as a dielectric mask layer. In some embodiments, the second mask layer 111 may comprise a metal nitride compound, such as TiN, or the like. Accordingly, the second mask layer 111 may be also referred as a metal mask layer.

In some embodiments, the first mask layer 109 comprises silicon carbide, which is doped with oxygen (O) and nitrogen (N). Contents of carbon and nitrogen in the first mask layer 109 are tuned to achieve desired etching characteristics for the first mask layer 109. In some embodiment, an atomic percentage of nitrogen is less than about 5%, and an atomic percentage of carbon is between about 14% and about 36%. In other embodiments, the first mask layer 109 is substantially free from nitrogen.

Figure 2:
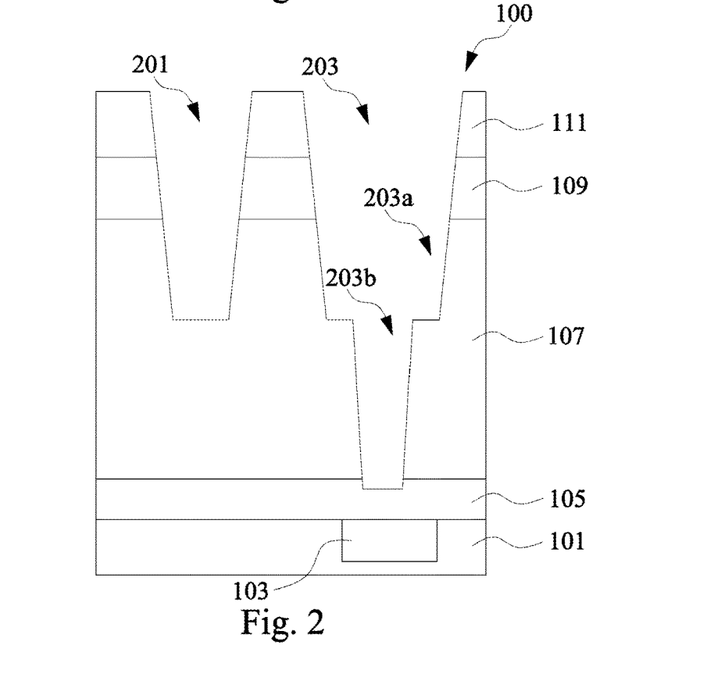

Referring to FIG. 2, a first opening 201 and a second opening 203 are formed in the dielectric layer 107. The first opening 201 may also be referred as a first trench 201. In the illustrated embodiment, the second opening 203 comprises a second trench 203a and a plug/via hole 203b. In some embodiments, the first opening 201 and the second opening 203 may be formed using a plug/via first or a trench first process.

In an embodiment with the first opening 201 and the second opening 203 formed using a plug/via first process, the plug/via hole 203b is formed before forming the first trench 201 and the second trench 203a. In some embodiments, a first patterned mask (not shown) is formed on the second mask layer 111. A material of the first patterned mask is deposited on the second mask layer 111. The material of the first patterned mask is then irradiated (exposed), and developed to remove a portion of the material of the first patterned mask, thereby forming the first patterned mask. In some embodiments, the material of the first patterned mask may comprise a photoresist, or any suitable photo-patternable material.

In some embodiments, the first patterned mask is used to pattern the first mask layer 109, the second mask layer 111, and the dielectric layer 107 and form the plug/via hole 203b. Portions of the first mask layer 109, the second mask layer 111, and the dielectric layer 107 unprotected by the first patterned mask are subsequently etched using a first etch process. In some embodiments, the first etch process may comprise one or more etch processes, such as, for example, an anisotropic dry etch process, or the like. In some embodiments, the entire first patterned mask may be fully consumed prior to completion of the first etch process. In such a case, the first mask layer 109 and the second mask layer 111 are used as an etch mask to complete the first etch process.

Referring further to FIG. 2, the first etch process stops when the plug/via hole reaches the first ESL 105 and a portion of the first ESL 105 is exposed. In alternative embodiments, the first etch process stops before the plug/via hole reaches the first ESL 105 and the first ESL 105 is not exposed. Subsequently, remaining portions of the first patterned mask, if any, are removed. In some embodiments, the first patterned mask formed of a photoresist material is removed using, for example, an ashing process in combination with a wet clean process.

After forming the plug/via hole 203b, the first trench 201 and the second trench 203a are formed in the dielectric layer 107. In some embodiments, a second patterned mask (not shown) is formed on the second mask layer 111. A material of the second patterned mask is deposited on the second mask layer 111. The material of the second patterned mask is then irradiated (exposed), and developed to remove a portion of the material of the second patterned mask, thereby forming the second patterned mask. In some embodiments, the material of the second patterned mask may comprise a photoresist, or any suitable photo-patternable material.

In some embodiments, the second patterned mask is used to pattern the first mask layer 109, the second mask layer 111, and the dielectric layer 107 and form the first trench 201 and the second trench 203a. Portions of the first mask layer 109, the second mask layer 111, and the dielectric layer 107 unprotected by the second patterned mask are subsequently etched using a second etch process. In some embodiments, the second etch process may comprise one or more etch processes, such as, for example, an anisotropic dry etch process, or the like. In some embodiments, the entire second patterned mask may be fully consumed prior to completion of the second etch process. In such a case, the first mask layer 109 and the second mask layer 111 are used as an etch mask to complete the second etch process.

Referring further to FIG. 2, the second etch process may further extend the plug/via hole 203b. In the illustrated embodiment, a portion of the first ESL 105 is etched by the second etch process and the plug/via hole 203b partially extends into the first ESL 105. Subsequently, remaining portions of the second patterned mask, if any, are removed. In some embodiments, the second patterned mask formed of a photoresist material is removed using, for example, an ashing process in combination with a wet clean process.

In other embodiments, the first opening 201 and the second opening 203 are formed using a trench first process. In such an embodiment, formation process of the first opening 201 and the second opening 203 is similar to the plug/via hole first process described above with a distinction that the first trench 201 and the second trench 203a are formed before forming the plug/via hole 203b.

Figure 3:
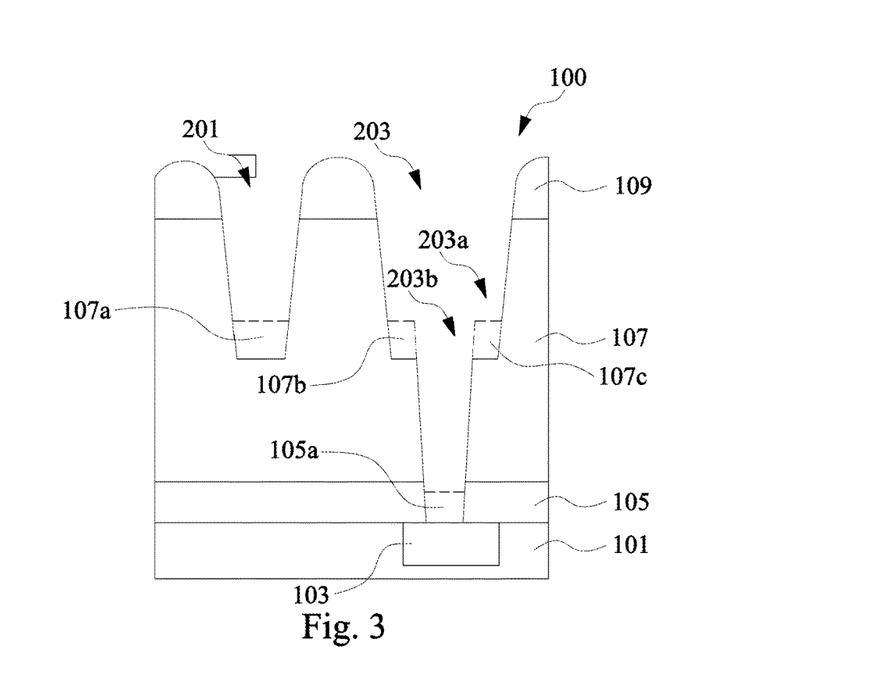

Referring to FIG. 3, the second mask layer 111 is removed from the semiconductor device 100. In some embodiments, the second mask layer 111 is removed using, for example, a blanket etch process. For example, in an embodiment in which the second mask layer 111 is formed of TiN, an etch process using a $CF_4$ plasma may be used to remove the second mask layer 111. In other embodiments, other suitable removal processes may be used to remove the second mask layer 111. In some embodiment, the first mask layer 109 remains on the dielectric layer 107 to protect the dielectric layer 107 a damage (e.g., plasma damage) induced by a subsequent etch process. In addition, as described in greater detail below, the first mask layer 109 aids in formation of interconnect structures in the dielectric layer 107.

Referring further to FIG. 3, a third etch process is performed to extend the first opening 201 and the second opening 203 towards the underlying layer 101, such that the second opening 203 exposes the conductive feature 103 in the underlying layer 101. In some embodiments, the third etch process may comprise one or more etch processes, such as for example, an anisotropic dry etch process, or the like. The third etch process removes portions 107a-107c of the dielectric layer 107 and a portion 105a of the first ESL 105 as illustrated in FIG. 3. Moreover, in some embodiments, the third etch process rounds corners of the first mask layer 109. In some embodiments, the third etch process may have less anisotropy compared to the first etch process and the second etch process.

As described in greater detail below, the first opening 201 and the second opening 203 are filled with a conductive material to form interconnects in the dielectric layer 107. In some embodiments, the third etch process may etch the dielectric layer 107 faster than the first mask layer 109 and may form undercuts (not shown) in the dielectric layer 107 below the first mask layer 109. The undercuts in the dielectric layer 107 may adversely affect the filling process of the first opening 201 and the second opening 203 such that the interconnects formed in the first opening 201 and the second opening 203 may have voids and may not have desired conductive properties (e.g., resistance).

In some embodiments, to improve filling characteristics of the first opening 201 and the second opening 203, a material for the first mask layer 109 and parameters of the third etch process are carefully tuned, such that sidewalls of the first mask layer 109 smoothly join sidewalls of the first opening 201 and the second opening 203, thereby reducing or preventing formation of the undercuts in the dielectric layer 107. Moreover, the third etch process rounds corners of the first mask layer 109, which further improves filling characteristics of the first opening 201 and the second opening 203.

In some embodiments in which the first mask layer 109 is formed of oxygen and nitrogen doped silicon carbide and the dielectric layer 107 is formed of a low-K material (e.g., $SiOCH_3$), the third etch process is an anisotropic dry etch process performed using a mixture of gasses $C_xF_y$, $N_2$, $O_2$, and Ar. In some embodiments a flow rate of $C_xF_y$ is between about 20 standard cubic centimeters per minute (SCCM) to about 50 SCCM, a flow rate of $N_2$ is less than about 100 SCCM, a flow rate of $O_2$ is less than about 25 SCCM, and a flow rate of Ar is between about 600 SCCM and about 1200 SCCM. In addition, the third etch process may be performed at a temperature between about 40° C. and about 70° C., a pressure about 20 mTorr to about 80 mTorr, a voltage between about −500 V and about 0 V, a low radio frequency (RF) power less than about 50 W, and a high RF power between about 100 W and about 300 W. In some embodiments, the dielectric layer 107 to the first mask layer 109 etch selectivity is between about 1 and about 1.5 in a vertical direction, and the dielectric layer 107 to the first mask layer 109 etch selectivity is about 1 in a lateral direction (perpendicular to the vertical direction).

Figure 4:
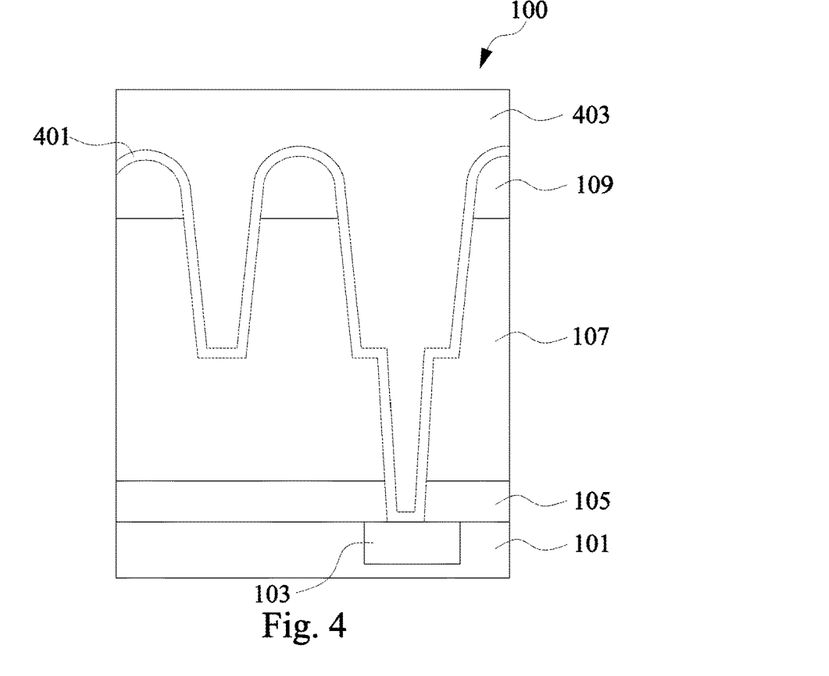

Referring to FIG. 4, a barrier layer (not shown) and a seed layer 401 are formed on inner surfaces of the first opening 201, the second opening 203, and on the first mask layer 109. The barrier layer may be selected from a group of W, WN, Ti, Al, TiAl, TiN, TiAlN, Ta, TaC, TaN, TaCN, TaSiN, Mn, Zr, Nb, Ru, or the like. The barrier layer may be formed by ALD, CVD, PVD, sputtering, the like, or a combination thereof. The seed layer 401 may comprise Cu, Al, Ag, Au, the like, or alloys thereof. The seed layer 401 may be formed by a process including, but not limited to, ALD, CVD, PVD, sputtering, plating, the like, or a combination thereof.

Referring further to FIG. 4, a conductive material 403 is formed in the first opening 201 and the second opening 203. In some embodiments, the conductive material 403 overfills the first opening 201 and the second opening 203 and is formed over the first mask layer 109. The conductive material 403 may be formed by a process including, but not limited to, ALD, CVD, PVD, sputtering, plating, the like, or a combination thereof. The conductive material 403 may comprise Cu, Al, Ag, Au, the like, or alloys thereof.

Figure 5:
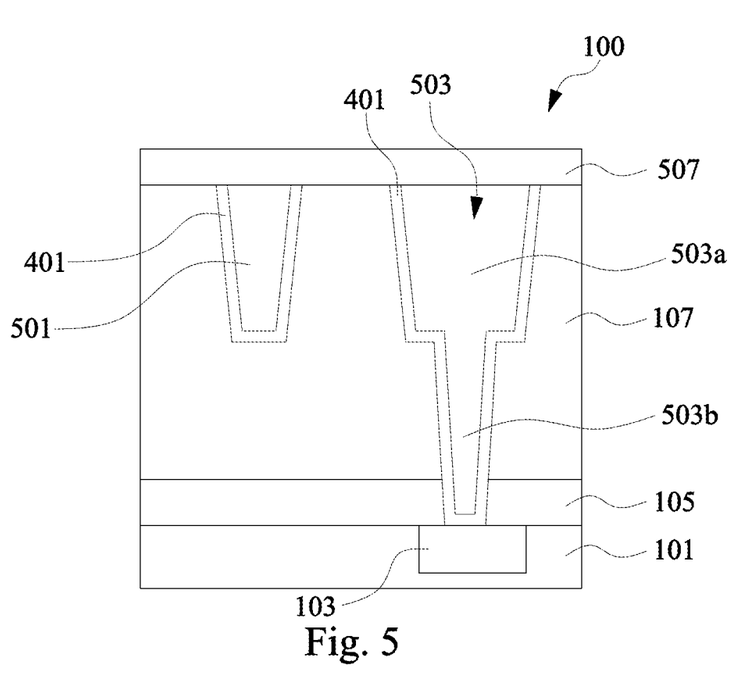

Referring to FIG. 5, a first conductive feature 501 and a second conductive feature 503 are formed in the first opening 201 and the second opening 203, respectively. In the illustrated embodiment, the first mask layer 109 and portions of the conductive material 403 extending above the topmost surface of the dielectric layer 107 are removed such that the topmost surfaces of the first conductive feature 501 and the second conductive feature 503 are substantially coplanar with the topmost surface of the dielectric layer 107. In some embodiments, the first mask layer 109 and the portions of the conductive material 403 extending above the topmost surface of the dielectric layer 107 are removed using, for example, an etch process, a polishing process such as chemical-mechanical polishing (CMP), the like, or a combination thereof.

Referring further to FIG. 5, the first conductive feature 501 may be also referred as a first conductive line 501. In the illustrated embodiment, the second conductive feature 503 comprises a second conductive line 503a and a conductive plug/via 503b. FIG. 5 further illustrates formation of a second ESL 507 over the dielectric layer 107, the first conductive feature 501, and the second conductive feature 503. In some embodiments, the second ESL 507 may comprise SiO, SiC, SiN, SiOC, SiON, SiCN, TiN, MN, AlON, TEOS, hard black diamond (HBD), or the like.

Alternatively, the second ESL 507 may be formed by depositing and annealing a metal oxide of Hf, Al, or the like. The second ESL 507 may be formed using a suitable process such as ALD, CVD, PVD, the like, or a combination thereof.

Figure 6:
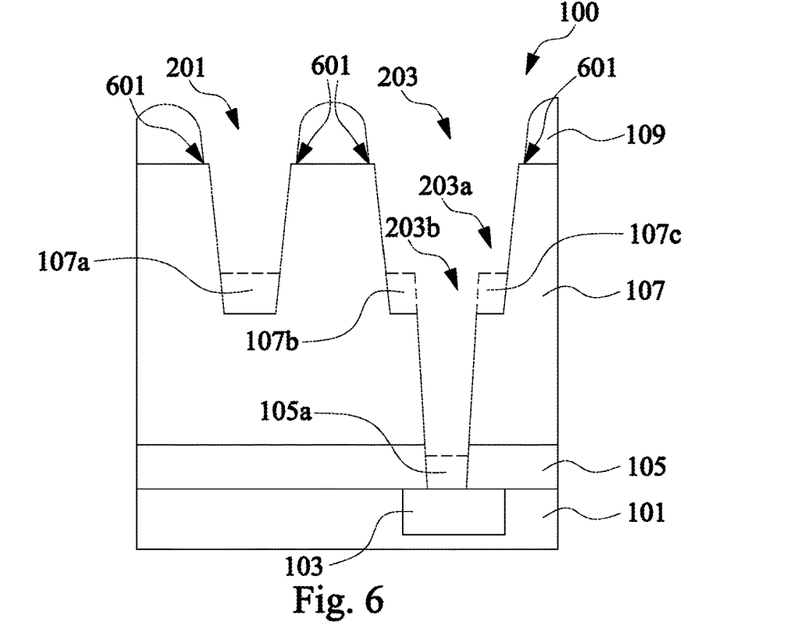
FIGS. 6 and 7 are cross-sectional views of a semiconductor device at various stages of fabrication in accordance with some alternative embodiments.
Figure 7:
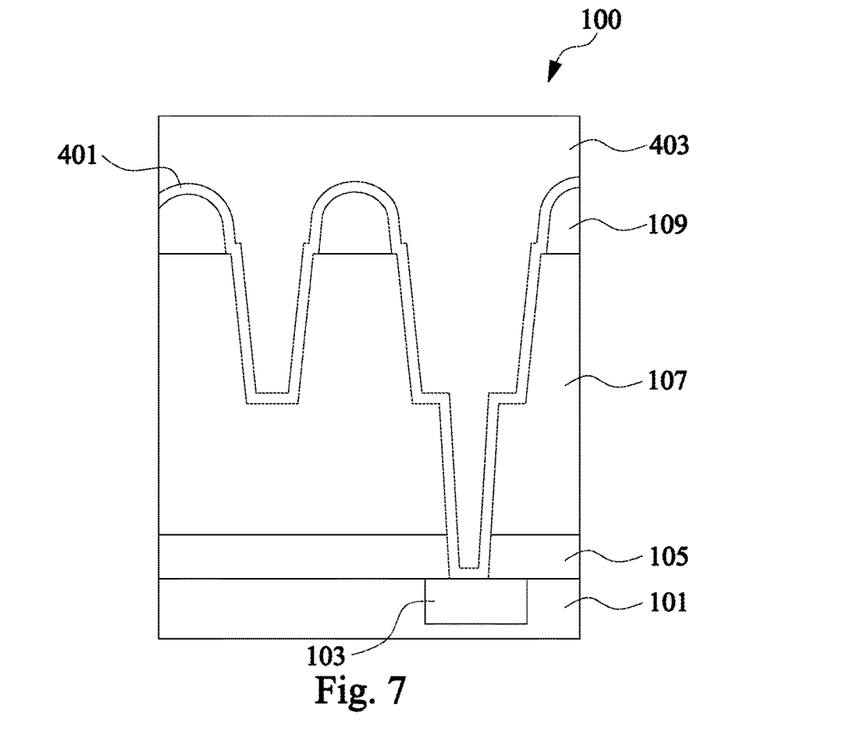

FIGS. 6 and 7 are cross-sectional views of the semiconductor device 100 at various stages of fabrication in accordance with some alternative embodiments. In particular, FIGS. 6 and 7 describe alternative processes performed on a structure of FIG. 2. Furthermore, the processes illustrated in FIGS. 6 and 7 are alternatives to processes described above with reference to FIGS. 3 and 4, and unless otherwise noted, elements of FIGS. 6 and 7 that are similar to those of FIGS. 3 and 4 are labeled by the same numerals.

Turning first to FIG. 6, the second mask layer 111 is removed from the structure shown in FIG. 2 and a third etch process is performed to extend the first opening 201 and the second opening 203 towards the underlying layer 101, such that the second opening 203 exposes the conductive feature 103 in the underlying layer 101. In addition, the third etch process rounds the corners of the first mask layer 109. In the illustrated embodiment, parameters of the third etch process are tuned such that portions 601 of the uppermost surface of the dielectric layer 107 are exposed. In some embodiments, the dielectric layer 107 to the first mask layer 109 etch selectivity is between about 1 and about 1.5 in the vertical direction, with the first mask layer 109 having a higher etch rate than the dielectric layer 107 in the lateral direction.

Referring next to FIG. 7, a barrier layer (not shown) and a seed layer 401 are formed on inner surfaces of the first opening 201, the second opening 203, and on the first mask layer 109. In the illustrated embodiment, the barrier layer and the seed layer 401 are also formed on the portions 601 of the uppermost surface of the dielectric layer 107. FIG. 7 further illustrates formation of a conductive material 403 in the first opening 201 and the second opening 203. Furthermore, additional processes described above with reference to FIG. 5 are performed on a structure illustrated in FIG. 7 to form the semiconductor device 100 as illustrated in FIG. 5, and the description is not repeated herein.

Figure 8:
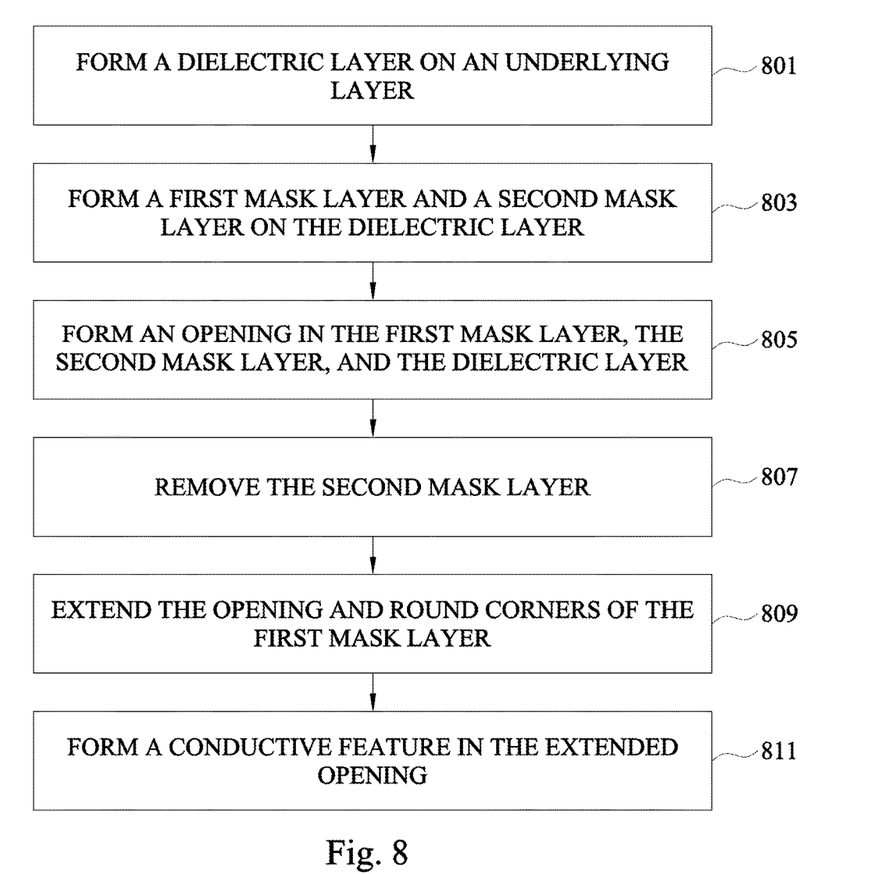
FIG. 8 is a flowchart illustrating a method of forming a semiconductor device in accordance with some embodiments.

FIG. 8 is a flowchart illustrating a method of forming a semiconductor device in accordance with some embodiments. The method starts with step 801, wherein a dielectric layer (such as the dielectric layer 107) is formed over an underlying layer (such as the underlying layer 101) as described above with reference to FIG. 1. In step 803, a first mask layer and a second mask layer (such as the first mask layer 109 and the second mask layer 111) are formed on the dielectric layer as described above with reference to FIG. 1. In step 805, an opening (such as the first opening 201 or the second opening 203) is formed in the first mask layer, the second mask layer and the dielectric layer as described above with reference to FIG. 2. Subsequently, in step 807, the second mask layer is removed as described above with reference to FIG. 3. In step 809, the opening is extended and corners of the first mask layer are rounded as described above with reference to FIG. 3. Finally, in step 811, a conductive feature (such as the first conductive feature 501 or the second conductive feature 503) is formed in the extended opening as described above with reference to FIGS. 4 and 5.

The methods of the present disclosure are not limited to be used by a planar device and can be applied to a non-planar device as well, such as a fin-like field effect transistor (FinFET), or a nanowire device. Based on the discussions above, it can be seen that by using the methods of the present disclosure, issues (e.g., formation of voids) with filling openings in dielectric layers while forming conductive features can be mitigated or completely avoided. As a result, the yield and reliability of the device can be well controlled by using the methods of the present disclosure.

According to an embodiment, a method of forming a semiconductor device, the method comprises forming a dielectric layer over an underlying layer, forming a first mask layer on the dielectric layer, and forming an opening, the opening extending through the first mask layer and into the dielectric layer. The method further comprises rounding corners of the first mask layer, and forming a first conductive feature in the opening.

According to another embodiment, a method of forming a semiconductor device, the method comprises depositing a dielectric layer over an underlying layer, depositing a first mask layer and a second mask layer on the dielectric layer, wherein the first mask layer is interposed between the dielectric layer and the second mask layer, and performing a first etch, the first etch forming an opening, wherein the opening extends through the first mask layer, the second mask layer, and into the dielectric layer. The method further comprises removing the second mask layer, performing a second etch, the second etch rounding corners of the first mask layer, and filling the opening with a conductive material, thereby forming a first conductive feature.

According to yet another embodiment, a method of forming a semiconductor device, the method comprises providing a substrate, forming a first dielectric layer on the substrate, and forming a second dielectric layer on the first dielectric layer. The method further comprises forming a first mask layer and a second mask layer on the second dielectric layer, wherein the first mask layer is interposed between the second dielectric layer and the second mask layer, and forming a first opening and a second opening, the first opening extending through the first mask layer, the second mask layer, and partially extending through the second dielectric layer, the second opening extending through the first mask layer, the second mask layer, and the second dielectric layer. The method further comprises removing the second mask layer, extending the first opening and the second opening, thereby forming an extended first opening and an extended second opening, rounding corners of the first mask layer, and forming a first conductive feature in the extended first opening and a second conductive feature in the extended second opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a dielectric layer over an underlying layer;
    forming a first mask layer on the dielectric layer;
    after forming the first mask layer, forming an opening by removing at least a portion of the dielectric layer, the opening extending through the first mask layer and into the dielectric layer;
    after forming the opening, rounding corners of the first mask layer, wherein the rounding comprises recessing an edge of the first mask layer from an edge of the opening in the dielectric layer and exposing portions of a topmost surface and sidewalls of the dielectric layer, wherein the exposed portions of the topmost surface of the dielectric layer extend between the opening and the first mask layer; and
    forming a first conductive feature in the opening in the dielectric layer.

2. The method of claim 1, further comprising:
    forming a second mask layer on the first mask layer; and
    prior to the rounding, removing the second mask layer.

3. The method of claim 1, wherein the forming the first conductive feature comprises:
    forming a barrier layer on sidewalls and a bottom of the opening;
    forming a seed layer over the barrier layer; and
    forming a conductive material over the seed layer.

4. The method of claim 1, wherein the opening exposes a second conductive feature.

5. The method of claim 1, wherein the rounding comprises performing an etch with a mixture of $C_xF_y$, $N_2$, $O_2$, and Ar.

6. The method of claim 5, wherein the dielectric layer to the first mask layer etch selectivity is between about 1 and about 1.5 in a direction perpendicular to an uppermost surface of the first mask layer.

7. The method of claim 1, wherein the first mask layer comprises oxygen and nitrogen doped silicon carbide.

8. A method of forming a semiconductor device, the method comprising:
    depositing a dielectric layer over an underlying layer;
    depositing a first mask layer and a second mask layer on the dielectric layer, wherein the first mask layer is interposed between the dielectric layer and the second mask layer;
    performing a first etch, the first etch forming an opening, wherein the opening extends through the first mask layer, the second mask layer, and into the dielectric layer;
    removing the second mask layer;
    performing a second etch, the second etch rounding corners of the first mask layer, wherein the first mask layer has a higher etch rate than the dielectric layer during the second etch in a direction parallel to a topmost surface of the first mask layer; and
    filling the opening with a conductive material, thereby forming a first conductive feature, wherein the second etch exposes portions of a topmost surface of the dielectric layer.

9. The method of claim 8, wherein the second etch is performed with a mixture of $C_xF_y$, $N_2$, $O_2$, and Ar.

10. The method of claim 8, wherein the first mask layer comprises oxygen and nitrogen doped silicon carbide.

11. The method of claim 10, wherein an atomic percentage of carbon in the first mask layer is between about 14% and about 36%, and an atomic percentage of nitrogen in the first mask layer is less than about 5%.

12. A method of forming a semiconductor device, the method comprising:
    providing a substrate;
    forming a first dielectric layer on the substrate;
    forming a second dielectric layer on the first dielectric layer;
    forming a first mask layer and a second mask layer on the second dielectric layer, wherein the first mask layer is interposed between the second dielectric layer and the second mask layer;
    forming a first opening and a second opening, the first opening extending through the first mask layer, the second mask layer, and into the second dielectric layer, a bottom of the first opening being within the second dielectric layer, the second opening extending through the first mask layer, the second mask layer, and the second dielectric layer, and exposing at least a portion of the first dielectric layer;

removing the second mask layer;

extending the first opening and the second opening, thereby forming an extended first opening and an extended second opening;

rounding corners of the first mask layer; and forming a first conductive feature in the extended first opening and a second conductive feature in the extended second opening.

13. The method of claim 12, wherein the extending the first opening and the second opening comprises performing an etch with a mixture of $C_xF_y$, $N_2$, $O_2$, and Ar.

14. The method of claim 13, wherein the second dielectric layer to the first mask layer etch selectivity is between about 1 and about 1.5 in a direction perpendicular to a topmost surface of the first mask layer, and wherein the first mask layer has a higher etch rate than the second dielectric layer in a direction parallel to a topmost surface of the first mask layer.

15. The method of claim 12, wherein the extending the first opening and the second opening further comprises exposing portions of a topmost surface of the second dielectric layer.

16. The method of claim 12, wherein the extending and the rounding are performed during same process steps.

17. The method of claim 12, wherein the forming the first conductive feature and the second conductive feature comprises:

depositing a barrier layer on sidewalls of the extended first opening and the extended second opening;

depositing a seed layer over the barrier layer; and depositing a conductive material over the seed layer.

18. The method of claim 1, further comprising, after forming the first conductive feature in the opening, removing the first mask layer to expose the dielectric layer.

19. The method of claim 8, wherein the second etch extends the opening through the dielectric layer.

* * * * *